United States Patent
Harvey

(10) Patent No.: US 9,742,363 B2
(45) Date of Patent: *Aug. 22, 2017

(54) CROSSOVER AND AMPLIFIER BASED CANALPHONE SYSTEM

(71) Applicant: Jerry Harvey, Apopka, FL (US)

(72) Inventor: Jerry Harvey, Apopka, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/984,036

(22) Filed: Dec. 30, 2015

(65) Prior Publication Data

US 2016/0112017 A1   Apr. 21, 2016

Related U.S. Application Data

(63) Continuation of application No. 13/420,948, filed on Mar. 15, 2012, now Pat. No. 9,253,570.

(51) Int. Cl.
*H03G 5/00* (2006.01)
*H03F 3/183* (2006.01)
*H04R 3/14* (2006.01)
*H04R 1/10* (2006.01)
*H04R 3/04* (2006.01)

(52) U.S. Cl.
CPC ............ *H03F 3/183* (2013.01); *H04R 1/1016* (2013.01); *H04R 3/04* (2013.01); *H04R 3/14* (2013.01); *H03F 2200/03* (2013.01)

(58) Field of Classification Search
CPC ... H04R 3/04; H04R 3/12; H04R 3/14; H04R 25/00; H03F 2200/03
USPC .................. 381/99, 312, 380, 328, 417, 418
See application file for complete search history.

(56) References Cited

U.S. PATENT DOCUMENTS

| | | | | |
|---|---|---|---|---|
| 8,565,447 B2* | 10/2013 | Waller, Jr. | ................ | G10H 1/12 381/118 |
| 2006/0133636 A1* | 6/2006 | Harvey | ................ | H04R 1/1016 381/380 |
| 2007/0025561 A1* | 2/2007 | Gauger, Jr. | .......... | H04R 1/1025 381/71.6 |
| 2007/0121964 A1* | 5/2007 | Rumreich | ................ | H04R 3/14 381/99 |
| 2007/0242837 A1* | 10/2007 | Glen | ...................... | H03G 9/005 381/101 |
| 2009/0112905 A1* | 4/2009 | Mukerjee | .......... | G06F 17/30625 |
| 2011/0299714 A1* | 12/2011 | Ma | ....................... | H04R 1/1033 381/384 |

* cited by examiner

*Primary Examiner* — William A Jerez Lora
(74) *Attorney, Agent, or Firm* — Douglas J Visnius

(57) ABSTRACT

A canalphone system may include a high audio driver, and a low audio driver adjacent to the high audio driver. The system may also include an amplifier that amplifies an audio signal and delivers that amplified audio signal to the high audio driver and/or the low audio driver. The system may further include a passive audio crossover, the passive audio crossover receives the amplified audio signal from the amplifier and then delivers the amplified audio signal in a suitable frequency range to the high audio driver and/or the low audio driver. The system may additionally include a second amplifier, and a high portion of the passive audio crossover, the high portion of the passive audio crossover to receive the audio signal from the second amplifier and to limit the audio signal delivered to the high audio driver to a high frequency portion of the amplified audio signal.

14 Claims, 2 Drawing Sheets

CROSSOVER AND AMPLIFIER BASED CANALPHONE SYSTEM

BACKGROUND OF THE INVENTION

Field of the Invention

The invention relates to the field of canalphones.

Description of Background

There are many different types of personal listening devices such as headphones, earbuds, canalphones, and/or the like. Headphones are personal listening devices that are held in close proximately to the ear by some support system. Earbuds are small personal listening devices that are positioned directly in front of the ear canal and are substantially smaller than a person's outer ear. Similarly, canalphones are personal listening devices that are substantially smaller than a person's outer ear, but they differ from earbuds in that they are placed directly in one end of the ear canal. Both earbuds and canalphones are held in positioned by friction between the ear and the device rather than the support system found in most headphones.

Canalphones are also referred to as in-ear monitors due to how the canalphone is worn by a listener. In other words, a canalphone housing is worn in the ear of the user and not over and/or around the ear of the user. Some canalphones also serve as earplugs due to the way the canalphone limits noise external to the canalphone from entering the ear canal.

SUMMARY OF THE INVENTION

According to one embodiment of the invention, a canalphone system may include a high audio driver carried by a canalphone housing, and a low audio driver carried by the canalphone housing adjacent to the high audio driver. The system may also include an amplifier that amplifies an audio signal and delivers that amplified audio signal to the high audio driver and/or the low audio driver. The system may further include a passive audio crossover carried by the canalphone housing, the passive audio crossover receives the amplified audio signal from the amplifier and then delivers the amplified audio signal in a suitable frequency range to the high audio driver and/or the low audio driver.

The system may additionally include a second amplifier, and a high portion of the passive audio crossover carried by the canalphone housing, the high portion of the passive audio crossover to receive the audio signal from the second amplifier and to limit the audio signal delivered to the high audio driver to a high frequency portion of the amplified audio signal. The system may also include a gain control to regulate an output to input ratio of the amplifier and/or the second amplifier.

The system may further include a second gain control to regulate an output to input ratio of the amplifier driving the low audio driver output. The system may additionally include the amplifier and/or the second amplifier operating in a frequency range of 10 hertz to 65 kilohertz.

The system may also include the amplifier and/or the second amplifier controlling the balancing of the audio signal's frequency components. The system may further include an audio connection-port carried by the canalphone housing that configures the system into an active state and/or a passive state.

In another embodiment, the system may include a high audio driver carried by a canalphone housing, and a low audio driver carried by the canalphone housing adjacent to the high audio driver. The system may also include a passive audio crossover carried by the canalphone housing without any amplifier between the passive audio crossover and the high audio driver and/or the low audio driver, the passive audio crossover receives the audio signal from an audio source and limits the audio signal delivered to the high audio driver and/or the low audio driver to a suitable frequency range. The system may further include an audio interface to carry the audio signal from the audio source to the passive audio crossover through bonding of a high portion of the passive audio crossover's positive input to a low portion of the passive audio crossover's positive input, and through bonding of a high portion of the passive audio crossover's negative input to a low portion of the passive crossover's negative input.

The audio interface may include an audio cable and/or an audio cable adaptor. The audio interface may include four conductors bonded into two conductors. The system may additionally include an audio connection-port carried by the canalphone housing to mate with the audio interface that configures the system into an active state and/or a passive state.

In another embodiment, the system may include a high audio driver carried by a canalphone housing, and a low audio driver carried by the canalphone housing adjacent to the high audio driver. The system may also include a passive audio crossover carried by the canalphone housing, the passive audio crossover receives the audio signal from the audio source and then delivers the audio signal in a suitable frequency range to the high audio driver and/or the low audio driver. The system may further include in a first state, an amplifier that amplifies the audio signal sent to the passive audio crossover which delivers that amplified audio signal to the high audio driver and/or the low audio driver. The system may additionally include in a second state that operates without any amplifiers between the passive audio crossover and the high audio driver and/or the low audio driver, an audio interface to carry the audio signal from the audio source to the passive audio crossover in which a high connection of the passive audio crossover's positive input is bonded to a low connection of the passive audio crossover's positive input, and a high connection of the passive audio crossover's negative input is bonded to a low connection of the passive audio crossover's negative input.

The system may also include in the first state a second amplifier, and a high portion of the passive audio crossover carried by the canalphone housing, the high portion of the passive audio crossover to receive the audio signal from the second amplifier and to limit the audio signal delivered to the high audio driver to a high frequency portion of the amplified audio signal. The system may further include in the first state a gain control to regulate an output to input ratio of the amplifier and/or the second amplifier.

The system may additionally include in the first state a second gain control to regulate an output to input ratio of the amplifier driving the low audio driver output. The amplifier and/or the second amplifier operates in a frequency range of 10 hertz to 65 kilohertz. The amplifier and/or the second amplifier controls balancing of the audio signal's frequency components.

The system may also include in the second state the audio interface as comprising an audio cable and/or an audio cable adaptor. The audio interface may include four conductors bonded into two conductors.

The system may also include an audio connection-port carried by the canalphone housing to connect the amplifier to the passive audio crossover thus configuring the system into an active state, and/or to mate with the audio interface thus configuring the system into a passive state.

DETAILED DESCRIPTION

Embodiments will now be described more fully hereinafter with reference to the accompanying drawings, in which preferred embodiments are shown. Like numbers refer to like elements throughout, and like numbers with letter suffixes are used to identify similar parts in a single embodiment.

Figure 1:
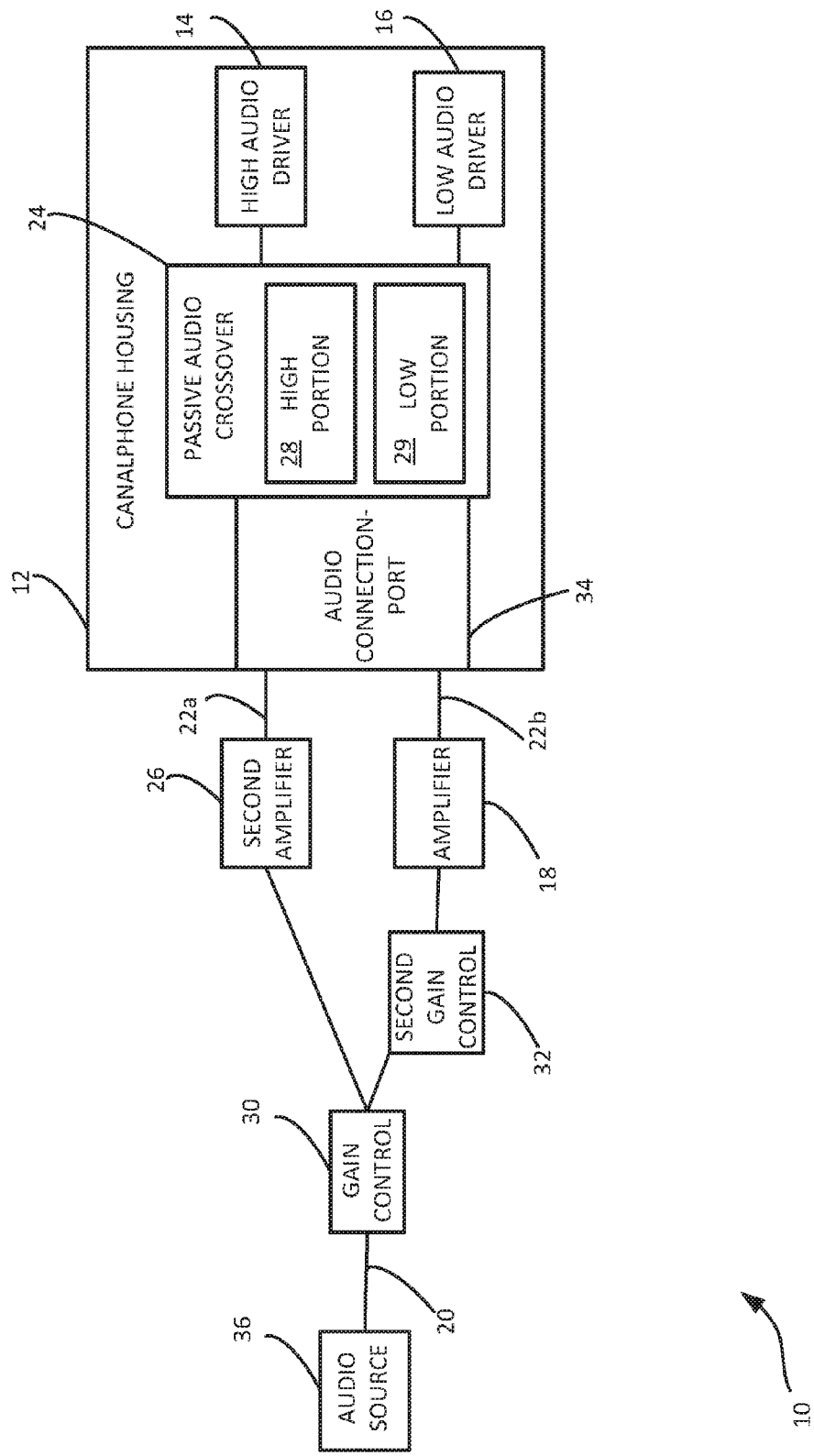
FIG. 1 is a schematic block diagram of a system in accordance with the invention.

With reference now to FIG. 1, a crossover based canalphone system 10 is initially described. The system 10 includes a canalphone housing 12 that frictionally engages the ear of a user (not shown) in its usage position.

In one embodiment, the system 10 includes a high audio driver 14 carried by the canalphone housing 12, and a low audio driver 16 carried by the canalphone housing adjacent to the high audio driver. The system 10 also includes an amplifier 18 that amplifies an audio signal 20 and delivers that amplified audio signal 22b to the high audio driver 14 and/or the low audio driver 16. In one embodiment, the amplifier 18 is carried by the canalphone housing 12, while in an alternative embodiment, the amplifier is external to the canalphone housing.

The system 10 further includes a passive audio crossover 24 carried by the canalphone housing 12. For example, the passive audio crossover 24 enables filtering of the audio signal 20 within the canalphone housing 12 rather than just attenuation of the audio signal. In addition, the passive audio crossover 24 does not provide any audio signal 20 gain thus making it passive. The passive audio crossover 24 receives the amplified audio signal 22b from the amplifier 18 and then delivers the amplified audio signal in a suitable frequency range to the high audio driver 14 and/or the low audio driver 16. For example, a suitable frequency range would be high frequencies delivered to the high audio driver 14, low frequencies delivered to the low audio driver 16, and/or the like.

In one embodiment, the system 10 additionally includes a second amplifier 26, and a high portion 28 of the passive audio crossover 24 carried by the canalphone housing 12. The high portion 28 of the passive audio crossover 24 receives the audio signal 20 from the second amplifier 26 and limits the audio signal delivered to the high audio driver 14 to a high frequency portion of the amplified audio signal 22a. In one embodiment, the second amplifier 26 is carried by the canalphone housing 12, while in an alternative embodiment, the second amplifier is external to the canalphone housing.

In one embodiment, the system 10 also includes a gain control 30 to regulate an output to input ratio of the amplifier 18 and/or the second amplifier 26. In another embodiment, the system 10 further includes a second gain control 32 to regulate an output to input ratio of the amplifier 18 driving the low audio driver's 16 output.

In one embodiment, the system 10 additionally includes the amplifier 18 and/or the second amplifier 26 operating in a frequency range of 10 hertz to 65 kilohertz. In other words, the amplifier 18 and/or the second amplifier 26 comprises full range amplifiers.

In one embodiment, the system 10 also includes the amplifier 18 and/or the second amplifier 26 controlling the balancing of the audio signal's 20 frequency components. Stated another way, the amplifier 18 and/or the second amplifier 26 enables equalization of the audio signal's 20 frequency components.

In one embodiment, the system 10 further includes an audio connection-port 34 carried by the canalphone housing 12 that configures the system into an active state and a passive state. In the active state, the amplifier 18 connects to the passive crossover 24 through audio connection-port 34. In other words, the audio connection-port 34 makes the system 10 configurable and/or upgradeable.

Figure 2:
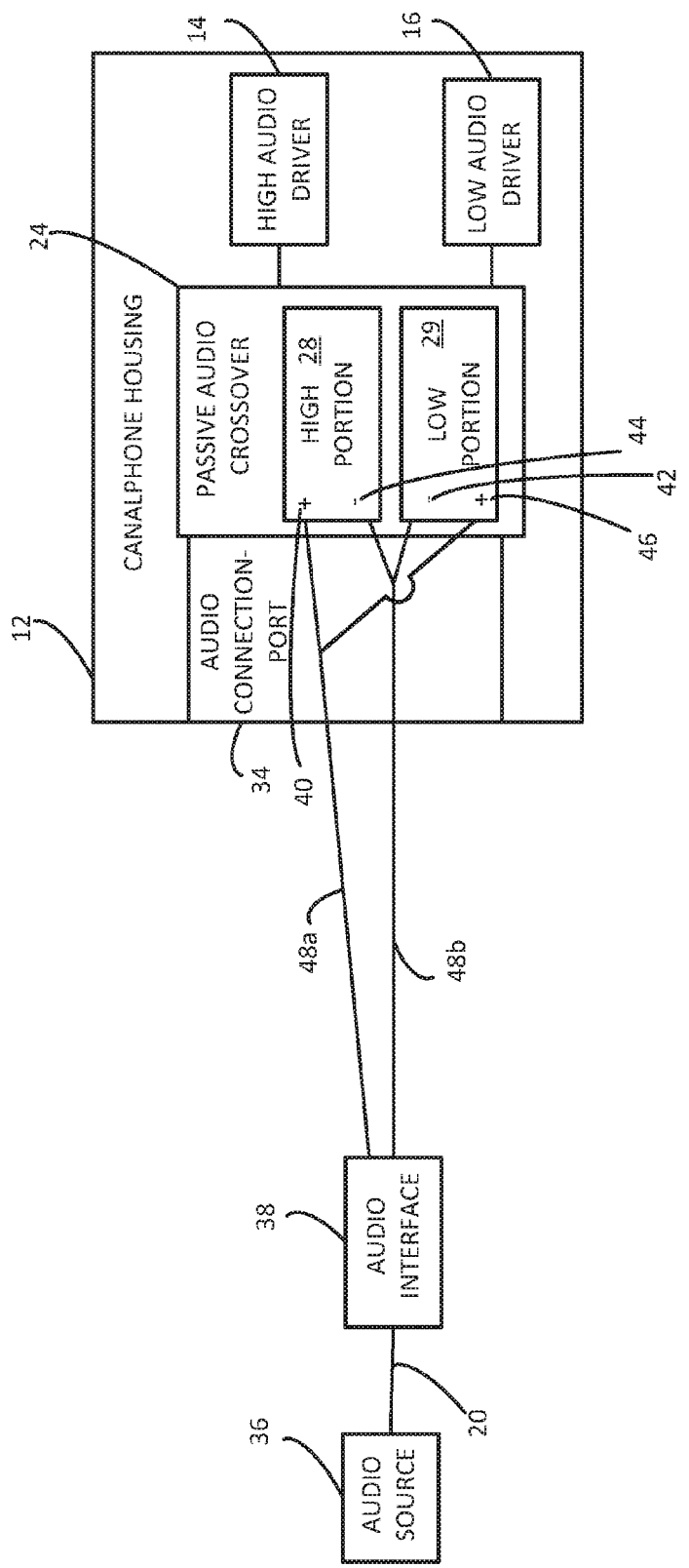
FIG. 2 is a schematic block diagram of an alternative system in accordance with the invention.

In another embodiment and with additional reference to FIG. 2, the system 10 includes the high audio driver 14 carried by the canalphone housing 12, and the low audio driver 16 carried by the canalphone housing adjacent to the high frequency driver. The system 10 also includes the passive audio crossover 24 carried by the canalphone housing 12 without any amplifier between the passive audio crossover and the high audio driver 14 and/or the low audio driver 16. For instance in this passive state, the system 10 still provides audio signal 20 filtering but uses less power because it is a passive system, e.g. no gain is provided by the passive audio crossover.

The passive audio crossover 24 receives the audio signal 20 from an audio source 36 and limits the audio signal 20 delivered to the high audio driver 14 and/or the low audio driver 16 to a suitable frequency range. For example, a suitable frequency range would be high frequencies delivered to the high audio driver 14, low frequencies delivered to the low audio driver 16, and/or the like.

The system 10 further includes an audio interface 38 to carry the audio signal 20 from the audio source 36 to the passive audio crossover 24 through bonding of a high portion of the passive audio crossover's 24 positive input 40 to a low portion 29 of the passive audio crossover's positive input 42, and through bonding of a high portion of the passive audio crossover's negative input 44 to a low portion of the passive crossover's negative input 46. For example, the audio interface 38 includes four conductors bonded into two conductors 48a and 48b.

In one embodiment, the audio interface 38 includes an audio cable, an audio cable adaptor, and/or the like. In another embodiment, the system 10 additionally includes an audio connection-port 34 carried by the canalphone housing 12 to mate with the audio interface 38 to configure the system into an active state and/or a passive state.

In another embodiment, the system 10 includes the high audio driver 14 carried by the canalphone housing 12, and the low audio driver 16 carried by the canalphone housing adjacent to the high audio driver. The system 10 also includes a passive audio crossover 24 carried by the canalphone housing, the passive audio crossover receives an audio signal 20 from an audio source 36 and then delivers the audio signal in a suitable frequency range to the high audio driver 14 and/or the low audio driver 16. The system 10 further includes in a first state, an amplifier 18 that amplifies the audio signal 20 sent to the passive audio crossover 24 which delivers that amplified audio signal 22b to at least one of the high audio driver 14 and the low audio driver 16. The system additionally includes in a second state that operates without any amplifiers between the passive audio crossover 24 and the high audio driver 14 and/or the low audio driver 16, an audio interface 38 to carry the audio signal 20 from the audio source 36 to the passive audio crossover through bonding of a high portion 28 of the passive audio crossover's positive input 40 to a low portion 29 of the passive audio crossover's positive input 42, and through bonding of a high portion of the passive audio crossover's negative input 44 to a low portion of the passive crossover's negative input 46.

In other words, the preceding embodiment includes both FIGS. 1 and 2 as a combination. Such an embodiment allows a user to select the operational form of the embodiment, e.g. an active first state and/or a passive second state. As a result, the system 10 provides upgradeable performance because the passive second state that is non-amplified can be upgraded at a later date to include one or more amplifiers to the passive form of the system by an end consumer, e.g. user of the system. Similarly, system 10 provides power saving performance because the amplifiers 18 and/or 26 in the active first state can be easily removed by an end consumer so that the system can run as the passive form found in the second state. In addition, the active first state enables the end consumer to add gain for each driver, e.g. speakers 14 and/or 16, as is needed, which means the number of amplifiers can be tailored by the user's needs.

In one embodiment the system 10 also includes in the first state, a second amplifier 26, and a high portion 28 of the passive audio crossover 24 carried by the canalphone housing 12, the high portion of the passive audio crossover to receive the audio signal 20 from the second amplifier and to limit the audio signal delivered to the high audio driver 14 to a high frequency portion of the amplified audio signal 22a. In another embodiment the system 10 further includes in the first state, a gain control 30 to regulate an output to input ratio of the amplifier 18 and/or the second amplifier 26.

In one embodiment the system 10 additionally includes in the first state, a second gain control 32 to regulate an output to input ratio of the amplifier 18 driving the low audio driver 16 output. In another embodiment, the amplifier 18 and/or the second amplifier 26 operates in a frequency range of 10 hertz to 65 kilohertz. In another embodiment, the amplifier 18 and/or the second amplifier 26 controls balancing of the audio signal's 20 frequency components.

In one embodiment, the system 10 also includes in the second state the audio interface 38 comprising an audio cable, an audio cable adaptor, and/or the like. In another embodiment, the audio interface 38 includes four conductors bonded into two conductors 48a and 48b.

In one embodiment, the system 10 includes an audio connection-port 34 carried by the canalphone housing 12 to connect the amplifier 18 to the passive audio crossover 24 thus configuring the system into an active state, and/or to mate with the audio interface 38 thus configuring the system into a passive state.

Since a canalphone housing 12 is very small, it is very difficult to achieve any of the preceding embodiments. However, system 10 overcomes the technical hurdles of providing more components in less space, providing superior sound reproduction, and provides a user configurable canalphone system.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
   a high audio driver carried by a canalphone housing;
   a low audio driver carried by the canalphone housing adjacent to the high audio driver;
   an amplifier that amplifies an audio signal and delivers that amplified audio signal to at least one of the high audio driver and the low audio driver, the amplifier being non-destructively removable by a user;
   a passive audio crossover carried by the canalphone housing, the passive audio crossover receives the amplified audio signal from the amplifier and then delivers the amplified audio signal in a suitable frequency range to at least one of the high audio driver and the low audio driver;
   a second amplifier, the second amplifier being non-destructively removable by the user; and
   a high portion of the passive audio crossover carried by the canalphone housing, the high portion of the passive audio crossover to receive the audio signal from the second amplifier and to limit the audio signal delivered to the high audio driver to a high frequency portion of the amplified audio signal.

2. The system of claim 1 further comprising a gain control to regulate an output to input ratio of at least one of the amplifier and the second amplifier.

3. The system of claim 2 further comprising a second gain control to regulate an output to input ratio of the amplifier driving the low audio driver output.

4. The system of claim 1 wherein at least one of the amplifier and the second amplifier operates in a frequency range of 10 hertz to 65 kilohertz.

5. The system of claim 4 wherein at least one of the amplifier and the second amplifier controls balancing of the audio signal's frequency components.

6. The system of claim 1 further comprising an audio connection-port carried by the canalphone housing that configures the system into at least one of an active state and a passive state.

7. A system comprising:
   a high audio driver carried by a canalphone housing;
   a low audio driver carried by the canalphone housing adjacent to the high audio driver;
   a passive audio crossover carried by the canalphone housing, the passive audio crossover receives an audio signal from an audio source and then delivers the audio signal in a suitable frequency range to at least one of the high audio driver and the low audio driver;
   in a first state, an amplifier that amplifies the audio signal sent to the passive audio crossover which delivers that amplified audio signal to at least one of the high audio driver and the low audio driver, the amplifier being non-destructively removable by a user; and
   in a second state that operates without any amplifiers between an audio source and the high audio driver and the low audio driver, the audio interface carries the audio signal from the audio source to the passive audio crossover through bonding of a high portion of the passive audio crossover's positive input to a low portion of the passive audio crossover's positive input, and through bonding of a high portion of the passive audio crossover's negative input to a low portion of the passive crossover's negative input;

a second amplifier, the second amplifier being non-destructively removable by the user; and a high portion of the passive audio crossover carried by the canalphone housing, the high portion of the passive audio crossover to receive the audio signal from the second amplifier and to limit the audio signal delivered to the high audio driver to a high frequency portion of the amplified audio signal.

8. The system of claim 7 further comprising in the first state a gain control to regulate an output to input ratio of at least one of the amplifier and the second amplifier.

9. The system of claim 8 further comprising a second gain control to regulate an output to input ratio of the amplifier driving the low audio driver output.

10. The system of claim 7 wherein at least one of the amplifier and the second amplifier operates in a frequency range of 10 hertz to 65 kilohertz.

11. The system of claim 10 wherein at least one of the amplifier and the second amplifier controls balancing of the audio signal's frequency components.

12. The system of claim 7 wherein in the second state the audio interface comprises at least one of an audio cable and an audio cable adaptor.

13. The system of claim 7 wherein in the second state the audio interface comprises four conductors bonded into two conductors.

14. The system of claim 7 further comprising an audio connection-port carried by the canalphone housing to at least one of connect the amplifier to the passive audio crossover thus configuring the system into an active state, and to mate with the audio interface thus configuring the system into a passive state.

* * * * *